US009899552B2

United States Patent
Watzke et al.

(10) Patent No.: US 9,899,552 B2
(45) Date of Patent: Feb. 20, 2018

(54) EDGE-PROTECTION TAPE

(71) Applicant: tesa SE, Hamburg (DE)

(72) Inventors: Wilhelm Watzke, Hamburg (DE); Werner Kluge-Paletta, Buchholz (DE); Andreas Stein, Hamburg (DE)

(73) Assignee: TESA SE, Norderstedt (DE)

( * ) Notice: Subject to any disclaimer, the term of this patent is extended or adjusted under 35 U.S.C. 154(b) by 426 days.

(21) Appl. No.: 13/921,959

(22) Filed: Jun. 19, 2013

(65) Prior Publication Data

US 2013/0340827 A1  Dec. 26, 2013

(30) Foreign Application Priority Data

Jun. 20, 2012 (DE) .................. 10 2012 210 386

(51) Int. Cl.
| | |
|---|---|
| H01L 31/00 | (2006.01) |
| H01L 31/048 | (2014.01) |
| B32B 5/18 | (2006.01) |
| C09J 7/02 | (2006.01) |
| B32B 3/08 | (2006.01) |
| B32B 7/12 | (2006.01) |
| B32B 27/06 | (2006.01) |
| B32B 27/30 | (2006.01) |
| B32B 27/32 | (2006.01) |
| B32B 27/36 | (2006.01) |
| B32B 27/40 | (2006.01) |

(52) U.S. Cl.
CPC ............ *H01L 31/0488* (2013.01); *B32B 3/08* (2013.01); *B32B 5/18* (2013.01); *B32B 7/12* (2013.01); *B32B 27/065* (2013.01); *B32B 27/304* (2013.01); *B32B 27/32* (2013.01); *B32B 27/36* (2013.01); *B32B 27/40* (2013.01); *C09J 7/021* (2013.01); *C09J 7/0289* (2013.01); *C09J 7/0296* (2013.01); *H01L 31/048* (2013.01); *B32B 2266/025* (2013.01); *B32B 2266/0221* (2013.01); *B32B 2266/0242* (2013.01); *B32B 2405/00* (2013.01); *B32B 2457/12* (2013.01); *C09J 2203/322* (2013.01); *Y02E 10/50* (2013.01); *Y10T 428/24967* (2015.01)

(58) Field of Classification Search
CPC ............................. H01L 31/0488; B32B 3/08
See application file for complete search history.

(56) References Cited

U.S. PATENT DOCUMENTS

| | | | |
|---|---|---|---|
| 5,602,457 A * | 2/1997 | Anderson | B32B 17/10036 136/251 |
| 5,789,487 A | 8/1998 | Matyjaszewski et al. | |
| 5,854,364 A | 12/1998 | Senninger et al. | |
| 5,945,491 A | 8/1999 | Matyjaszewski et al. | |
| 6,720,399 B2 | 4/2004 | Husemann et al. | |
| 6,765,078 B2 | 7/2004 | Husemann et al. | |
| 6,974,853 B2 | 12/2005 | Husemann et al. | |
| 2004/0131846 A1 | 7/2004 | Epple et al. | |
| 2006/0263596 A1* | 11/2006 | Bamborough | B29C 47/0021 428/354 |

FOREIGN PATENT DOCUMENTS

| | | |
|---|---|---|
| DE | 202008006624 U1 | 9/2009 |
| DE | 102009014873 A1 | 10/2010 |
| EP | 1311555 B1 | 5/2003 |
| EP | 1719808 A2 | 11/2006 |
| EP | 2256826 A2 | 12/2010 |
| JP | 2003522249 A | 7/2003 |
| JP | 2010278358 A | 12/2010 |
| JP | 2014512668 A | 5/2014 |
| TW | 200420704 A | 10/2004 |
| WO | 0157152 A2 | 8/2001 |
| WO | 2006027387 A1 | 3/2006 |
| WO | 2008049464 A1 | 5/2008 |
| WO | 2012112361 A2 | 8/2012 |

OTHER PUBLICATIONS

English translation of Taiwanese Office Action and Search Report for corresponding application 102114578 dated Jun. 16, 2016.
English translation of Chinese Office Action and Search Report for corresponding application 21310245730.3 dated Jun. 7, 2016.
English translation of Japanese Office Action for corresponding application JP 2013122584 dated Dec. 7, 2016.

* cited by examiner

*Primary Examiner* — Shannon Gardner
(74) *Attorney, Agent, or Firm* — Norris McLaughlin & Marcus PA

(57) ABSTRACT

A self-adhesive edge-protection tape is intended to improve the protective effect for glass edges. This is achieved by providing an adhesive tape which comprises, in sequence directed towards the substrate to be covered, a backing layer (hard phase) and a soft phase comprising a polymer foam, a viscoelastic composition and/or an elastomeric composition, where the thickness of the hard phase is ≤150 μm, the thickness of the soft phase is ≥200 μm and the ratio of the thickness of the soft phase to the thickness of the hard phase is ≥4. The invention also relates to a solar module which comprises an adhesive tape according to the invention adhesive-bonded around at least one portion of the edges thereof, and the use of the claimed adhesive tape for the protection of edges of a solar module.

9 Claims, No Drawings

EDGE-PROTECTION TAPE

This application claims priority to the German patent application DE 10 2012 210 386.4 filed Jun. 20, 2012.

The present invention relates to the technical sector of adhesive tapes. In particular, the invention proposes a self-adhesive edge-protection tape which exhibits improved protective effect for glass edges, specifically for glass edges of solar modules.

The use of photovoltaic systems for the generation of electricity from sunlight is becoming ever more widespread. Conventional photovoltaic systems are generally composed of a plurality of interconnected solar modules. These modules, which are also termed photovoltaic modules or, in abbreviation, PV modules, in turn comprise interconnected solar cells in which the energy of sunlight is converted into electrical energy. Solar cells are based on silicon, and are therefore also often termed silicon wafers. Thick-layer silicon cells are the most widespread, taking the form of either monocrystalline (c-Si) or multicrystalline (mc-Si) cells.

Alternative technologies are becoming increasingly important. By way of example, substrates are directly covered with a photoactive layer. The resultant thin-layer solar modules feature not only relatively low manufacturing costs but also relatively low weight. However, the effectiveness of these modules is currently still lower than for wafer technology. In another new development, flexible foils are also provided with photoactive layers, and flexible solar modules are thus produced. However, the conventional designs continue to have most importance.

An important requirement placed upon solar modules is that they have adequate protection from mechanical effects. This is not achieved without some difficulty, since solar modules comprise glass substrates which naturally have only limited resistance to vibrations and are fragile. Transport of solar modules and operations carried out thereon, inclusive of installation, expose them to a wide variety of mechanical stress. The usual method of protecting them from this is to surround them completely with an aluminium frame.

However, use of aluminium frames for edge-protection of solar modules has a number of concomitant disadvantages. Among these are not only that the cost for the frame is a relatively high proportion of the total cost of the solar module but also that the frame introduces weight, the aluminium-framing process involves a plurality of steps, and there is a risk of glass breakage during application of the frame. It is therefore desirable to provide alternatives to the aluminium-framing process for solar modules.

Examples of these alternatives can be self-adhesive protective tapes which surround the edges of the modules. Utility Model Specifications DE 20 2006 016 394 U1 and DE 20 2008 006 624 U1 describe edge-protection tapes to protect the edges of multiple glazing, where the protective tapes comprise specific functional elements, such as friction-reducing foils or a metallic external layer.

DE 10 2009 014 873 A1 describes a pressure-sensitive adhesive tape with a gas diffusion rate in respect of water vapour of at most 5 g/(m$^2$*d) per mm of adhesive tape thickness which can be used as self-adhesive sealing tape in solar modules.

EP 1 719 808 A2 relates to a pressure-sensitive adhesive laminate which comprises an exterior film layer, a polymer-based adhesive base layer and an adhesion-promoting layer which comprises at least one polymer and one adhesion promoter. The laminate is produced by first coextruding the film layer and the adhesive base layer and then applying the adhesion-promoting layer to the adhesive base layer.

In self-adhesive edge-protection tapes there is often a conflict between, on the one hand, the tape stiffness required for mechanical protection and, on the other hand, the flexibility needed for sheathing the edges. There is therefore a continuing need for edge-protection tapes for solar modules with well-developed protective effect in relation to mechanical effects, where the tapes can be applied easily and durably to the edges requiring protection.

It is an object of the present invention to provide a self-adhesive tape for the protection of glass edges which protects glass edges durably and effectively from mechanical damage such as that caused by exposure to shock or to abrasion. A particular intention is that the protective effect of the tape is not restricted by "lift" and, associated therewith, separation from the substrate.

The achievement of the object is based on the concept that underlies the invention: combining at least one hard phase and at least one soft phase with one another, each of these phases having been specifically designed. The invention therefore firstly provides an adhesive tape for the protection of glass edges, comprising, in sequence directed towards the substrate to be covered, a backing layer (hard phase) and a soft phase comprising a polymer foam, a viscoelastic composition and/or an elastomeric composition, where the thickness of the hard phase is ≤150 µm, the thickness of the soft phase is ≥200 µm and the ratio of the thickness of the soft phase to the thickness of the hard phase is ≥4. An adhesive tape of this type provides excellent edge protection in respect of mechanical effects, for example in relation to shock, to impact and/or to abrasion, and thus reduces the frequency of glass breakage, in particular in relatively large solar modules. The edge protection achieved is durable, since it is possible to avoid separation from the adhesive substrate caused by exposure of the tape to bending moments that are excessive in comparison with the adhesion.

The adhesive tape according to the invention comprises a backing layer, which according to the invention is also termed hard phase. According to the invention, the polymer basis of the hard phase is preferably one selected from the group consisting of polyvinyl chlorides (PVC), polyethylene terephthalates (PET), polyurethanes, polyolefins, polybutylene terephthalates (PBT), polycarbonates, polymethyl methacrylates (PMMA), polyvinyl butyrals (PVB), ionomers and mixtures of two or more of the polymers listed above. It is particularly preferable that the polymer basis of the hard phase is one selected from the group consisting of polyvinyl chlorides, polyethylene terephthalates, polyurethanes, polyolefins and mixtures of two or more of the polymers listed above. The hard phase is in essence a polymer foil, the polymer basis of which is one selected from the above materials. The expression "polymer foil" means a thin, sheet-like, flexible web that can be wound up, the material basis of which is in essence formed from one or more polymers.

The expression "polyurethanes" means broadly polymeric substances in which there are repeating units linked to one another via urethane groups —NH—CO—O—.

The expression "polyolefins" means polymers which comprise, based on molar quantities, at least 50% of repeating units of the general structure —[—CH$_2$—CR$^1$R$^2$—]$_n$—, in which R$^1$ is a hydrogen atom and R$^2$ is a hydrogen atom or a linear or branched, saturated aliphatic or cycloaliphatic group. To the extent that the polymer basis of the hard phase comprises polyolefins, it is particularly preferably that these involve polyethylenes, in particular polyethylenes with ultra-high molar mass (UHMWPE).

According to the invention, the expression "polymer basis" means the polymer(s) that make(s) up the largest proportion by weight of all of the polymers comprised in the layer or, respectively, phase in question.

According to the invention, the thickness of the hard phase is ≤150 µm. It is preferable that the thickness of the hard phase is from 10 to 150 µm, particularly from 30 to 120 µm and in particular from 50 to 100 µm, for example from 70 to 85 µm. According to the invention, the expression "thickness" means the dimension of the layer or, respectively, phase in question along the z-ordinate of an imaginary coordinate system in which the plane extending through the machine direction and the direction transverse to the machine direction forms the x-y plane. According to the invention, thickness is determined via measurement at at least five different locations of the layer or, respectively, phase in question, and then by calculating the arithmetic average from the measurement results obtained. Thickness measurement of the hard phase here is carried out in accordance with DIN EN ISO 4593.

It is preferable that the flexural stiffness of the hard phase of the claimed adhesive tape is at most 10 mN/mm. According to the invention, flexural stiffness is determined by fixing a test strip measuring 15 mm×75 mm of the material requiring testing on the specimen table. The specimen table can be tilted through 30°, in such a way that, during tilting, a medium requiring testing comes into contact with a force sensor. The force determined via the sensor represents a value that can be compared with flexural stiffness. An example of equipment suitable according to the invention for determining flexural stiffness is the Softometer KWS from Wolf.

The adhesive tape according to the invention moreover comprises a soft phase, which comprises a polymer foam, a viscoelastic composition and/or an elastomeric composition. The polymer basis of the soft phase is preferably one selected from polyolefins, polyacrylates, polyurethanes and mixtures of two or more of the polymers listed above.

According to the invention, the expression "polymer foam" means a structure made of gas-filled spherical or polyhedral cells which are delimited by liquid, semi-liquid, highly viscous or solid cell walls; the main constituent of the cell walls is moreover a polymer or a mixture of a plurality of polymers.

The expression "viscoelastic composition" means a material which has not only features of pure elasticity (reversion to the initial state after exposure to exterior mechanical effect) but also has features of a viscous liquid, an example being the effect of viscosity during deformation. In particular, polymer-based pressure-sensitive adhesive compositions are considered to be viscoelastic compositions.

The expression "elastomeric composition" means a material which has elastomeric behaviour and can be extended repeatedly to at least twice its length at 20° C. and, once the force required for extension is removed, immediately again assumes approximately its original dimension.

The statements above apply to the meaning which applies according to the invention of the expressions "polymer basis", "polyurethanes" and "polyolefins". The expression "polyacrylates" means polymers of which the monomer basis is composed, based on molar quantities, of at least 50% of acrylic acid, methacrylic acid, acrylates and/or methacrylates, where at least some proportion of acrylates and/or methacrylates is generally present and this is preferably at least 50%. In particular, the expression "polyacrylate" means a polymer which is obtainable via free-radical polymerization of acrylic and/or methylacrylic monomers, and also optionally of other, copolymerizable monomers.

It is particularly preferable that the polymer basis of the soft phase is one selected from polyolefins, polyacrylates and mixtures of two or more of the polymers listed above. To the extent that polyolefins are within the polymer basis of the soft phase, these are preferably those selected from polyethylenes, ethylene-vinyl acetate copolymers (EVA) and mixtures of polyethylenes and ethylene-vinyl acetate copolymers (PE/EVA blends). The polyethylenes here can be various types of polyethylene, such as HDPE, LDPE, LLDPE, blends of the said types of polyethylene and/or mixtures thereof.

In an embodiment of the invention, the soft phase comprises a foam and a pressure-sensitive adhesive layer arranged respectively above and below the foamed layer, where the polymer basis of the foam is composed of one or more polyolefins and the polymer basis of the pressure-sensitive adhesive layers is composed of one or more polyacrylates. It is particularly preferable that the polymer basis of the foam here is composed of one or more polyethylenes, ethylene-vinyl acetate copolymers and mixtures of one or more polyethylenes and/or ethylene-vinyl acetate copolymers. It is very particularly preferable that the polymer basis of the foam here is composed of one or more polyethylenes.

The polyolefin-based foam itself exhibits no, or only very little, property of pressure-sensitive adhesion. The bond with the hard phase or with the substrate is therefore advantageously brought about via the pressure-sensitive adhesive layers. The foaming of the polyolefin-based starting material for the foam is preferably brought about via added blowing gas for the purposes of a physical foaming process and/or via a chemical foaming agent, for example via azodicarbonamide.

In another embodiment of the invention, the soft phase is a polymer foam having the property of pressure-sensitive adhesion, the polymer basis of which is composed of one or more polyacrylates. The expression "foam having the property of pressure-sensitive adhesion" means that the foam itself is a pressure-sensitive adhesive composition, and there is therefore no requirement to apply any additional pressure-sensitive adhesive layer. This is advantageous because fewer layers have to be combined during the production process, and the risk of separation phenomena and of other undesired phenomena at the layer boundaries is reduced.

According to the invention, the expression "pressure-sensitive adhesive composition" means a material which sets to give a film which in the dry state at room temperature remains permanently tacky and capable of adhesion, where application of slight pressure immediately results in adhesive bonding on a wide variety of substrates.

The polyacrylates are preferably obtainable via polymerization of at least some proportion of functional monomers capable of crosslinking with epoxy groups. It is particularly preferable that these involve monomers having acid groups (particularly carboxylic acid groups, sulphonic acid groups or phosphonic acid groups) and/or hydroxy groups and/or anhydride groups and/or epoxy groups and/or amine groups; particular preference is given to monomers containing carboxylic acid groups. The polyacrylates very particularly advantageously comprise polymerized acrylic acid and/or methacrylic acid. All of these groups have the capability of crosslinking with epoxy groups, thus making thermal crosslinking with epoxides that have been introduced advantageously accessible to the polyacrylates.

Other monomers which can be used as comonomers for the polyacrylates are not only acrylates and/or methacrylates respectively having up to 30 carbon atoms but for example also vinyl carboxylates where the carboxylate moieties comprise up to 20 carbon atoms, vinylaromatics having up to 20 carbon atoms, ethylenically unsaturated nitriles, vinyl halides, vinyl ethers of alcohols comprising from 1 to 10 carbon atoms, aliphatic hydrocarbons having from 2 to 8 carbon atoms and 1 or 2 double bonds and mixtures of the said monomers.

The properties of the polyacrylate in question can in particular be influenced by using different proportions by weight of the individual monomers to vary the glass transition temperature of the polymer. The polyacrylates can preferably derive from the following monomer composition:
a) acrylates and/or methacrylates of the following formula $$CH_2=C(R^I)(COOR^{II})$$

where $R^I$=H or $CH_3$ and $R^{II}$ is an alkyl moiety having from 4 to 14 carbon atoms,
b) olefinically unsaturated monomers having functional groups of the type previously defined in relation to reactivity with epoxide groups,
c) optionally other acrylates and/or methacrylates and/or olefinically unsaturated monomers which are copolymerizable with component (a).

It is preferable that the polyacrylates derive from a monomer composition in which the proportion present of the monomers of component (a) is from 45 to 99% by weight, the proportion present at the monomers of component (b) is from 1 to 15% by weight and the proportion present of the monomers of component (c) is from 0 to 40% by weight (where the data are based on the monomer mixture for the "basis polymer", i.e. without additions of any possible additives to the finished polymer, for example resins, etc.). The glass transition temperature of the polymerization product in this case is ≤15° C. (DMA at low frequencies), and it has pressure-sensitive adhesive properties.

The monomers of component (a) are in particular plasticizing and/or non-polar monomers. It is preferable to use, as monomers (a), acrylates and methacrylates having alkyl groups composed of from 4 to 14 carbon atoms, particularly preferably from 4 to 9 carbon atoms. Examples of monomers of this type are n-butyl acrylate, n-butyl methacrylate, n-pentyl acrylate, n-pentyl methacrylate, n-amyl acrylate, n-hexyl acrylate, n-hexyl methacrylate, n-heptyl acrylate, n-octyl acrylate, n-octyl methacrylate, n-nonyl acrylate, isobutyl acrylate, isooctyl acrylate, isooctyl methacrylate, and branched isomers of these, for example 2-ethylhexyl acrylate or 2-ethylhexyl methacrylate.

The monomers of component (b) are in particular olefinically unsaturated monomers having functional groups, in particular having functional groups which can react with epoxide groups. It is preferable to use, for component (b), monomers having functional groups selected from the group consisting of: hydroxy groups, carboxy groups, sulphonic acid groups or phosphonic acid groups, anhydrides, epoxides, amines.

Particularly preferred examples of monomers of component (b) are acrylic acid, methacrylic acid, itaconic acid, maleic acid, fumaric acid, crotonic acid, aconitic acid, dimethylacrylic acid, β-acryloyloxypropionic acid, trichloroacrylic acid, vinylacetic acid, vinylphosphonic acid, itaconic acid, maleic anhydride, hydroxyethyl acrylate, hydroxypropyl acrylate, hdyroxyethyl methacrylate, hydroxypropyl methacrylate, 6-hydroxyhexyl methacrylate, allyl alcohol, glycidyl acrylate, glycidyl methacrylate.

In principle, any vinylically functionalized compound copolymerizable with component (a) and/or with component (b) can be used as component (c). The monomers of component (c) can serve for adjustment of the properties of the resultant pressure-sensitive adhesive composition.

Examples of monomers of component (c) are:
methyl acrylate, ethyl acrylate, propyl acrylate, methyl methacrylate, ethyl methacrylate, benzyl acrylate, benzyl methacrylate, sec-butyl acrylate, tert-butyl acrylate, phenyl acrylate, phenyl methacrylate, isobornyl acrylate, isobornyl methacrylate, tert-butylphenyl acrylate, tert-butylphenyl methacrylate, dodecyl methacrylate, isodecyl acrylate, lauryl acrylate, n-undecyl acrylate, stearyl acrylate, tridecyl acrylate, behenyl acrylate, cyclohexyl methacrylate, cyclopentyl methacrylate, phenoxyethyl acrylate, phenoxyethyl methacrylate, 2-butoxyethyl methacrylate, 2-butoxyethyl acrylate, 3,3,5-trimethylcyclohexyl acrylate, 3,5-dimethyladamantyl acrylate, 4-cumylphenyl methacrylate, cyanoethyl acrylate, cyanoethyl methacrylate, 4-biphenyl acrylate, 4-biphenyl methacrylate, 2-naphthyl acrylate, 2-naphthyl methacrylate, tetrahydrofurfuryl acrylate, diethylaminoethyl acrylate, diethylaminoethyl methacrylate, dimethylaminoethyl acrylate, dimethylaminoethyl methacrylate, 2-butoxyethyl acrylate, 2-butoxyethyl methacrylate, methyl 3-methoxyacrylate, 3-methoxybutyl acrylate, phenoxyethyl acrylate, phenoxyethyl methacrylate, 2-phenoxyethyl methacrylate, butyl diglycol methacrylate, ethylene glycol acrylate, ethylene glycol monomethylacrylate, methoxy polyethylene glycol methacrylate 350, methoxy polyethylene glycol methacrylate 500, propylene glycol monomethacrylate, butoxydiethylene glycol methacrylate, ethoxytriethylene glycol methacrylate, octafluoropentyl acrylate, octafluoropentyl methacrylate, 2,2,2-trifluoro-ethyl methacrylate, 1,1,1,3,3,3-hexafluoroisopropyl acrylate, 1,1,1,3,3,3-hexafluoroisopropyl methacrylate, 2,2,3,3,3-pentafluoropropyl methacrylate, 2,2,3,4,4,4-hexafluorobutyl methacrylate, 2,2,3,3,4,4,4-heptafluorobutyl acrylate, 2,2,3,3,4,4,4-heptafluorobutyl methacrylate, 2,2,3,3,4,4,5,5,6,6,7,7,8,8,8-pentadecafluorooctyl methacrylate, dimethylaminopropylacrylamide, dimethylaminopropylmethacrylamide, N-(1-methyl-undecyl)acrylamide, N-(n-butoxymethyl)acrylamide, N-(butoxymethyl)methacrylamide, N-(ethoxymethyl)acrylamide, N-(n-octadecyl)acrylamide, and also N,N-dialkyl-substituted amides, such as N,N-dimethylacrylamide, N,N-dimethylmethacrylamide, N-benzylacrylamide, N-isopropylacrylamide, N-tert-butylacrylamide, N-tert-octylacrylamide, N-methylolacrylamide, N-methylolmethacrylamide, acrylonitrile, methacrylonitrile, vinyl ethers, such as vinyl methyl ether, ethyl vinyl ether, vinyl isobutyl ether, vinyl esters, such as vinyl acetate, vinyl chloride, vinyl halides, vinylidene chloride, vinylidene halides, vinylpyridine, 4-vinylpyridine, N-vinylphthalimide, N-vinyllactam, N-vinylpyrrolidone, styrene, α- and p-methylstyrene, α-butylstyrene, 4-n-butylstyrene, 4-n-decylstyrene, 3,4-dimethoxystyrene, macromonomers, such as 2-polystyreneethyl methacrylate (molar mass Mw from 4000 to 13 000 g/mol), poly(methyl methacrylate)ethyl methacrylate (Mw from 2000 to 8000 g/mol).

Monomers of component (c) can also advantageously be selected in such a way that they comprise functional groups which assist subsequent radiochemical crosslinking (for example via electron beams or UV). Examples of suitable copolymerizable photoinitiators are benzoin acrylate and acrylate-functionalized benzophenone derivatives. Examples of monomers which assist crosslinking via irradiation with electrons are tetrahydrofurfuryl acrylate, N-tert-butylacrylamide and allyl acrylate.

The polyacrylates (where for the purposes of the invention, the expression "polyacrylates" is a synonym of "poly(meth)acrylates") can be produced by processes familiar to the person skilled in the art, and in particular advantageously via conventional free-radical polymerization processes or controlled free-radical polymerization processes. The polyacrylates can be produced via copolymerization of the monomeric components with use of the usual polymerization initiators and also optionally of regulators, where the polymerization process is carried out at the usual temperatures in bulk, in emulsion, for example in water or liquid hydrocarbons, or in solution.

It is preferable that the polyacrylates are produced via polymerization of the monomers in solvents, in particular in solvents with a boiling range from 50 to 150° C., preferably from 60 to 120° C., with use of the usual amounts of polymerization initiators, these generally being from 0.01 to 5% by weight, in particular from 0.1 to 2% by weight (based on the total weight of the monomers).

In principle, any of the usual initiators familiar to the person skilled in the art is suitable. Examples of free-radical sources are peroxides, hydroperoxides and azo compounds, for example dibenzoyl peroxide, cumene hydroperoxide, cyclohexanone peroxide, di-tert-butyl peroxide, cyclohexylsulphonyl acetyl peroxide, diisopropyl percarbonate, tert-butyl peroctoate, benzpinacol. One very preferred procedure uses, as free-radical initiator, 2,2'-azobis(2-methylbutyronitrile) (Vazo® 67™ from DuPont) or 2,2'-azobis(2-methylpropionitrile) (2,2'-azobisisobutyronitrile; AIBN; Vazo® 64™ from DuPont).

Solvents that can be used for the production of the polyacrylates are alcohols, such as methanol, ethanol, n- and isopropanol, n- and isobutanol, preferably isopropanol and/or isobutanol, and also hydrocarbons, such as toluene and in particular petroleum spirits having a boiling range from 60 to 120° C. It is also possible to use ketones, for example preferably acetone, methyl ethyl ketone, methyl isobutyl ketone, and esters, such as ethyl acetate, and also mixtures of solvents of the type mentioned, preference being given here to mixtures which comprise isopropanol, in particular in amounts of from 2 to 15% by weight, preferably from 3 to 10% by weight, based on the solvent mixture used.

The production (polymerization) of the polyacrylates is preferably followed by a concentration process, and the further processing of the polyacrylates proceeds in essence without solvent. The concentration process for the polymer can be carried out in the absence of crosslinking-agent substances and of accelerator substances. However, it is also possible to add one of these classes of compound to the polymer before the concentration process begins, so that the concentration process then takes place in the presence of the said substance(s).

After the concentration step, the polymers can be transferred to a compounder. The concentration process and the compounding process can optionally also take place in the same reactor.

The weight-average molar masses $M_W$ of the polyacrylates are preferably in the range from 20 000 to 2 000 000 g/mol; very preferably in the range from 100 000 to 1 000 000 g/mol, most preferably in the range from 150 000 to 500 000 g/mol (where the data for the average molar mass $M_W$ and for the polydispersity PD in this specification are based on determination via gel permeation chromatography). To this end, it can be advantageous to carry out the polymerization in the presence of suitable polymerization regulators, such as thiols, halogen compounds and/or alcohols, in order to establish the desired average molar mass.

The K value of the polyacrylate is preferably from 30 to 90, particularly preferably from 40 to 70, measured in toluene (1% solution, 21° C.). The Fikentscher K value is a measure of the molar mass and the viscosity of the polymer.

Particularly suitable polyacrylates are those having narrow molar mass distribution (polydispersity PD<4). These compositions have particularly good shear strength, despite relatively low molar mass, after crosslinking. The relatively low polydispersity moreover permits easier processing from the melt, since flow viscosity is lower than that of a more broadly distributed polyacrylate while performance characteristics are substantially identical. Narrowly distributed poly(meth)acrylates can advantageously be produced via anionic polymerization or via controlled free-radical polymerization methods, the latter having particularly good suitability. Examples of polyacrylates of this type produced by the RAFT process are described in U.S. Pat. No. 6,765,078 B2 and U.S. Pat. No. 6,720,399 B2. It is also possible to produce appropriate polyacrylates by way of N-oxyls, for example as described in EP 1 311 555 B1. Atom transfer radical polymerization (ATRP) can also be used advantageously for the synthesis of narrowly distributed polyacrylates, and it is preferable here to use, as initiator, monofunctional or difunctional secondary or tertiary halides and, to abstract the halide(s), complexes of one of the following: Cu, Ni, Fe, Pd, Pt, Ru, Os, Rh, Co, Ir, Ag or Au. The various possibilities provided by ATRP are described in the following specifications: U.S. Pat. No. 5,945,491 A, U.S. Pat. No. 5,854,364 A and U.S. Pat. No. 5,789,487 A.

The monomers for producing the polyacrylates preferably comprise some content of functional groups suitable for entering into linkage reactions with epoxide groups. This advantageously permits thermal crosslinking of the polyacrylates via reaction with epoxides. Linkage reactions in particular mean addition reactions and substitution reactions. It is therefore preferable that linkage takes place of the units bearing the functional groups with units bearing epoxy groups, in particular taking the form of crosslinking of the polymer units bearing the functional groups by way of, as linking bridges, crosslinking-agent molecules bearing epoxy groups. The substances containing epoxy groups preferably involve polyfunctional epoxides, i.e. epoxides having at least two epoxy groups; the overall effect is therefore preferably accordingly a mediated linkage of the units bearing the functional groups.

It is preferable that the polyacrylate(s) has/have been crosslinked via linkage reactions—in particular taking the form of addition reactions or substitution reactions—of functional groups present therein with thermal crosslinking agents. It is possible to use any of the thermal crosslinking agents which not only reliably provide a sufficiently long processing time, so that no gelling occurs during processing, but also lead to rapid post-crosslinking of the polymer to the desired degree of crosslinking at temperatures lower than the processing temperature, in particular at room temperature. A possible example is a combination of polymers comprising carboxy groups, amine groups and/or hydroxy groups and of isocyanates as crosslinking agents, in particular the aliphatic or amine-deactivated trimerized isocyanates described in EP 1 791 922 A1.

Suitable isocyanates are in particular trimerized derivatives of MDI [4,4-methylenedi(phenyl isocyanate)], HDI [hexamethylene diisocyanate, 1,6-hexylene diisocyanate] and/or IPDI [isophorone diisocyanate, 5-isocyanato-1-isocyanatomethyl-1,3,3-trimethylcyclohexane], for example the products Desmodur® N3600 and XP2410 (respectively from BAYER AG: aliphatic polyisocyanates, low-viscosity HDI trimerisates). An equally suitable product is the surface-deactivated dispersion of micronized trimerized IPDI BUEJ 339®, now HF9® (BAYER AG).

However, there are also other isocyanates that are in principle suitable for the crosslinking process, for example Desmodur VL 50 (MDI-based polyisocyanates, Bayer AG), Basonat F200WD (aliphatic polyisocyanate, BASF AG), Basonat HW100 (water-emulsifiable polyfunctional HDI-based isocyanate, BASF AG), Basonat HA 300 (allophanate-modified polyisocyanate based on isocyanurate/HDI, BASF) or Bayhydur VPLS2150/1 (hydrophilically modified IPDI, Bayer AG).

The amount used of the thermal crosslinking agent, for example the trimerized isocyanate, is preferably from 0.1 to 5% by weight, in particular from 0.2 to 1% by weight, based on the total amount of the polymer to be crosslinked.

The thermal crosslinking agent preferably comprises at least one substance containing epoxy groups. In particular, the substances containing epoxy groups involve polyfunctional epoxides, i.e. epoxides having at least two epoxy groups; accordingly, the overall effect is mediated linkage of the units bearing the functional groups. The substances containing epoxy groups can be either aromatic or else aliphatic compounds.

Polyfunctional epoxides having excellent suitability are oligomers of epichlorohydrin, epoxy ethers of polyhydric alcohols (in particular ethylene glycols, propylene glycols, and butylene glycols, polyglycols, thiodiglycols, glycerol, pentaerythritol, sorbitol, polyvinyl alcohol, polyallyl alcohol and the like), epoxy ethers of polyhydric phenols [in particular resorcinol, hydroquinone, bis(4-hydroxyphenyl) methane, bis(4-hydroxy-3-methylphenyl)methane, bis(4-hydroxy-3,5-dibromophenyl)methane, bis(4-hydroxy-3,5-difluorophenyl)methane, 1,1-bis(4-hydroxyphenyl)ethane, 2,2-bis(4-hydroxyphenyl)propane, 2,2-bis(4-hydroxy-3-methylphenyl)-propane, 2,2-bis(4-hydroxy-3-chlorophenyl)propane, 2,2-bis(4-hydroxy-3,5-dichlorophenyl)-propane, 2,2-bis(4-hydroxy-3,5-dichlorophenyl)propane, bis(4-hydroxyphenyl)phenylmethane, bis(4-hydroxyphenyl)phenylmethane, bis(4-hydroxyphenyl)diphenylmethane, bis(4-hydroxyphenyl)-4'-methylphenylmethane, 1,1-bis(4-hydroxyphenyl)-2,2,2-trichloroethane, bis(4-hydroxyphenyl)-(4-chlorophenyl)methane, 1,1-bis(4-hydroxyphenyl)cyclohexane, bis(4-hydroxyphenyl) cyclohexylmethane, 4,4'-dihydroxydiphenyl, 2,2'-dihydroxydiphenyl, 4,4'-dihydroxydiphenyl sulphone], and also hydroxyethyl ethers of these, phenol-formaldehyde condensates, such as phenol alcohols, phenol-aldehyde resins and the like, S- and N-containing epoxides (for example N,N-diglycidylaniline, N,N'-dimethyldiglycidyl-4,4-diaminodiphenylmethane), and also epoxides, where these have been produced by conventional processes from polyunsaturated carboxylic acids or from monounsaturated carboxylic acid moieties of unsaturated alcohols, glycidyl esters, polyglycidyl esters, where these can be obtained via polymerization or copolymerization of glycidyl esters of unsaturated acids, or from other acidic compounds (cyanuric acid, diglycidyl sulphide, cyclic trimethylene trisulphone or derivatives of these and other compounds).

Examples of very suitable ethers are 1,4-butanediol diglycidic ether, polyglycerol 3-glycidic ether, cyclohexanedimethanol diglycidic ether, glycerol triglycidic ether, neopentyl glycol diglycidic ether, pentaerythritol tetraglycidic ether, 1,6-hexanediol diglycidic ether), polypropylene glycol diglycidic ether, trimethylolpropane triglycidic ether, pentaerythritol tetraglycidic ether, bisphenol A diglycidic ether and bisphenol F diglycidic ether.

It is particularly preferable to use a crosslinking-agent-accelerator system ("crosslinking system") described by way of example in EP 1 978 069 A1, in order to obtain better control not only of the processing time and crosslinking kinetics but also of the degree of crosslinking. The crosslinking-agent-accelerator system comprises, as crosslinking agent, at least one substance containing epoxy groups, and, as accelerator, at least one substance which at a temperature below the melting point of the polymer to be crosslinked has an accelerating effect for crosslinking reactions by means of compounds containing epoxy groups.

Accelerators used are particularly preferably amines (formally regarded as substitution products of ammonia; in the formulae below the said substituents are depicted by "R" and in particular comprise alkyl and/or aryl moieties and/or other organic moieties), and in particular preference is given to those amines which enter into no, or only a very small extent of, reactions with the units of the polymers to be crosslinked.

In principle, accelerators that can be selected are either primary ($NRH_2$), secondary ($NR_2H$) or else tertiary amines ($NR_3$), and of course also those having a plurality of primary and/or secondary and/or tertiary amine groups. However, particularly preferred accelerators are tertiary amines, such as triethylamine, triethylenediamine, benzyldimethylamine, dimethylaminomethylphenol, 2,4,6-tris(N,N-dimethylaminomethyl)phenol, N,N'-bis(3-(dimethylamino)propyl)urea. Polyfunctional amines, such as diamines, triamines and/or tetramines, can advantageously also be used as accelerators. By way of example, diethylenetriamine, triethylenetetramine and trimethylhexamethylenediamine have excellent suitability.

Other preferred accelerators used are amino alcohols. It is particularly preferable to use secondary and/or tertiary amino alcohols, and in the case of a plurality of amine functionalities per molecule here it is preferable that at least one, preferably all of the amine functionalities are secondary and/or tertiary. Preferred amino alcohol accelerators that can be used are triethanolamine, N,N-bis(2-hydroxypropyl)ethanolamine, N-methyldiethanolamine, N-ethyldiethanolamine, 2-aminocyclohexanol, bis(2-hydroxycyclohexyl) methylamine, 2-(diisopropylamino)ethanol, 2-(dibutylamino)ethanol, N-butyldiethanolamine, N-butylethanolamine, 2-[bis(2-hydroxyethypamino]-2-(hydroxymethyl)-1,3-propanediol, 1-[bis(2-hydroxyethyl)amino]-2-propanol, triisopropanolamine, 2-(dimethylamino)ethanol, 2-(diethylamino)ethanol, 2-(2-dimethylaminoethoxy)ethanol, N,N,N'-trimethyl-N'-hydroxyethylbisaminoethyl ether, N,N,N'-trimethylaminoethylethanolamine and/or N,N,N'-trimethylaminopropylethanolamine.

Other suitable accelerators are pyridine, imidazoles (such as 2-methylimidazol) and 1,8-diazabicyclo[5.4.0]undec-7-ene. Cycloaliphatic polyamines can also be used as accelerators. Other suitable accelerators are phosphate-based, and also phosphines and/or phosphonium compounds, an example being triphenylphosphine or tetraphenylphosphonium tetraphenylborate.

According to the invention it is also possible that a polymer foam that per se has the property of pressure-sensitive adhesion, the polymer basis of which is composed of polyacrylate(s), has been coated on its upper and/or lower side with a pressure-sensitive adhesive composition, where the polymer basis of the said pressure-sensitive adhesive composition is preferably likewise composed of polyacrylates. Alternatively, it is possible to laminate, to the foamed layer, other adhesive layers and/or differently pretreated adhesive layers, i.e. by way of example pressure-sensitive adhesive layers and/or heat-activatable layers based on polymers other than poly(meth)acrylates. Suitable basis polymers are natural rubbers, synthetic rubbers, acrylate block copolymers, vinylaromatic block copolymers, in particular styrene block copolymers, EVA, polyolefins, polyurethanes, polyvinyl ethers and silicones. It is preferable that the said layers comprise no significant content of constituents that can migrate, where the compatibility of these with the material of the foamed layer is sufficiently good that significant amounts of these diffuse into the foamed layer and alter its properties.

The soft phase of the adhesive tape according to the invention can generally comprise at least one tackifying resin. Tackifying resins that can be used are in particular aliphatic, aromatic and/or alkylaromatic hydrocarbon resins, hydrocarbon resins based on pure monomers, hydrogenated hydrocarbon resins, functional hydrocarbon resins, and also natural resins. The tackifying resin is preferably one selected from the group consisting of pinene resins, indene resins and colophony resins, and their disproportionate, hydrogenated, polymerized and/or esterified derivatives and salts, terpene resins, and terpene-phenol resins, and also C5-hydrocarbon resins, C9-hydrocarbon resins and other hydrocarbon resins. Combinations of these and other resins can also be advantageously used in order to adjust the properties of the resultant adhesive composition as desired. The tackifying resin is particularly preferably one selected from the group consisting of terpene-phenol resins and colophony esters.

The soft phase of the adhesive tape according to the invention can comprise one or more fillers. The filler(s) can be present in one or more layers of the soft phase.

It is preferable that the soft phase comprises a polymer foam, and that the polymer foam comprises partially or fully expanded microballoons, in particular if the polymer basis of the polymer foam comprises one or more polyacrylates, and very particularly preferably if the polymer basis of the polymer foam is composed of one or more polyacrylates. Microballoons involve resilient hollow beads which have a thermoplastic polymer shell; they are therefore also called expandable polymeric microspheres or hollow microbeads. The said beads comprise low-boiling-point liquids or liquefied gas. Particular shell materials used are polyacrylonitrile, polyvinyl dichloride (PVDC), polyvinyl chloride (PVC), polyamides or polyacrylates. Particularly suitable low-boiling-point liquids are lower alkanes, such as isobutane or isopentane where these have been included in the form of liquefied gas, under pressure, within the polymer shell. Exposure of the microballoons to a physical effect, for example exposure to heat—in particular via heat introduction or heat generation, brought about by way of example via ultrasound or microwave radiation—firstly causes softening of the exterior polymer shell, and at the same time the liquid blowing gas located within the shell is converted to is gaseous state. When a particular combination of pressure and temperature—also termed critical combination—occurs the microballoons undergo an irreversible dimensional increase and expand in three dimensions. The expansion ends when internal and external pressure are equal. Since the polymeric shell is retained, the resultant product is a closed-cell foam.

A wide variety of types of microballoon are obtainable commercially, an example being the Expancel DU (dry unexpanded) products from Akzo Nobel, differentiated in essence by way of their size (from 6 to 45 µm diameter in the unexpanded state) and the initiation temperature required for their expansion (from 75° C. to 220° C.).

It is also possible to obtain unexpanded microballoon products in the form of aqueous dispersion with solids content or microballoon content of about 40 to 45% by weight, and moreover also in the form of polymer-bound microballoons (masterbatches), for example in ethylene-vinyl acetate with a concentration of about 65% by weight of microballoons. It is also possible to obtain what are known as microballoon slurry systems, in which the microballoons are present in the form of aqueous dispersion with solids contents of from 60 to 80% by weight. The microballoon dispersions, the microballoon slurries, and also the masterbatches, are, like the DU products, suitable for the foaming of a polymer foam present in the soft phase of the claimed adhesive tape.

According to the invention, it is particularly preferable that the polymer foam comprises microballoons which, in the unexpanded state at 25° C., have a diameter of from 3 µm to 40 µm, in particular from 5 µm to 20 µm, and/or which after expansion have a diameter of from 10 µm to 200 µm, in particular from 15 µm to 90 µm.

It is preferable that the polymer foam comprises up to 30% by weight of microballoons, in particular from 0.5% by weight to 10% by weight, based in each case on the total composition of the polymer foam.

The polymer foam of the soft phase of the adhesive tape according to the invention—to the extent that this phase comprises a polymer foam—is preferably characterized by the substantial absence of open-cell cavities. It is particularly preferable that the proportion of cavities without their own polymer shell, i.e. of open cells, is not more than 2% by volume in the polymer foam, in particular not more than 0.5% by volume. The polymer foam is therefore preferably a closed-cell foam.

The soft phase of the claimed adhesive tape can also optionally comprise pulverulent and/or granular fillers, dyes and pigments, and in particular also abrasive and reinforcing fillers, such as chalks ($CaCO_3$), titanium dioxides, zinc oxides and carbon blacks, inclusive of high proportions thereof, i.e. from 0.1 to 50% by weight, based on the total composition of the soft phase.

Other materials that can be present in the soft phase are low-flammability fillers, such as ammonium polyphosphate; electrically conductive fillers, such as conductive carbon black, carbon fibres and/or silver-coated beads; thermally conductive materials, such as boron nitride, aluminium oxide, silicon carbide; ferromagnetic additives, such as iron(III) oxides; other additives to increase volume, for example blowing agents, solid glass beads, hollow glass beads, carbonized microbeads, hollow phenolic microbeads, microbeads made of other materials; silica, silicates, organically renewable raw materials, such as wood flour, organic and/or inorganic nanoparticles, fibres; ageing inhibitors, light stabilizers, antiozonants and/or compounding agents. Ageing inhibitors that can be used are preferably either primary ageing inhibitors, e.g. 4-methoxyphenol or Irganox® 1076, or else secondary ageing inhibitors, e.g. Irgafos® TNPP or Irgafos® 168 from BASF, optionally also in combination with one another. Other ageing inhibitors that can be used are phenothiazine (C-radical scavenger), and also hydroquinone methyl ether in the presence of oxygen, and also oxygen itself.

The thickness of the soft phase is preferably from 200 to 1800 µm, particularly preferably from 300 to 1500 µm, in particular from 400 to 1000 µm. According to the invention, the thickness of the soft phase is determined in accordance with ISO 1923.

The bonding of hard and soft phase, or else of layers provided in the soft and/or hard phase, to one another to give the claimed adhesive tape can be achieved by way of example via lamination or coextrusion. There can be direct, i.e. unmediated, bonding between the hard and soft phase. It is equally possible that the arrangement has one or more adhesion-promoting layers between hard and soft phase. The claimed adhesive tape can moreover comprise other layers.

It is preferable that at least one of the layers to be bonded to one another has been pretreated by corona-pretreatment methods (using air or nitrogen), plasma-pretreatment methods (air, nitrogen or other reactive gases, or reactive compounds that can be used in the form of aerosol), or flame-pretreatment methods, and it is more preferable that a plurality of the layers to be bonded to one another have been thus pretreated, and it is very particularly preferable that all of the layers to be bonded to one another have been thus pretreated.

On the reverse side of the hard phase, i.e. on the side facing away from the substrate, there is preferably a functional layer applied which by way of example has release properties or UV-stabilizing properties. The said functional layer is preferably composed of a foil of thickness ≤20 µm, particularly preferably ≤10 µm, in particular ≤8 µm, for example ≤5 µm, or of a coating material of thickness ≤10 µm, particularly preferably ≤6 µm, in particular ≤3 µm, for example ≤1.5 µm. Both the foil and the coating material preferably comprise a UV absorber, and/or the polymer basis of the foil or of the coating material comprises UV-absorbing and/or UV-deflecting groups.

Foils can be applied to the reverse side of the hard phase via lamination or coextrusion. The foil preferably involves a metalized foil. The polymer basis of the foil is preferably one selected from the group consisting of polyarylenes, polyvinyl chlorides (PVC), polyethylene terephthalates (PET), polyurethanes, polyolefins, polybutylene terephthalates (PBT), polycarbonates, polymethyl methacrylates (PMMA), polyvinyl butyrals (PVB), ionomers and mixtures of two or more of the polymers listed above. The expression "main constituent" here means "constituent with the greatest proportion by weight, based on the total weight of the foil". It is preferable that, with the exception of the polyarylenes, all of the materials listed for the foil have a high content of UV stabilizers.

In one specific embodiment, the claimed adhesive tape is composed, in the sequence directed towards the substrate, of a functional layer (as described above); of a hard phase and of a soft phase composed of a pressure-sensitive adhesive layer, of a polymer foam, the polymer basis of which is composed of one or more polyolefins, and of another pressure-sensitive adhesive layer. The lower pressure-sensitive adhesive layer can have protective covering by a release liner which is not however considered to be part of the claimed adhesive tape.

In another specific embodiment, the claimed adhesive tape is composed, in sequence directed towards the substrate, of a functional layer (as described above); of a hard phase and of a soft phase which has the property of pressure-sensitive adhesion and the polymer basis of which is composed of one or more polyacrylates. Again, in this embodiment the lower side of the soft phase, i.e. the side facing towards the substrate, can have protective covering by a release liner which is not however considered to be part of the claimed adhesive tape.

The invention also provides a solar module which comprises a claimed adhesive tape, adhesive-bonded around at least one portion of the edges thereof.

The invention also provides the use of a claimed adhesive tape for the protection of edges of a solar module.

EXAMPLES

Methods

A) Measurement of Flexural Stiffness

The flexural stiffness was determined by using a Softometer KWS from Wolf. A test strip of the material to be tested here measuring 15 mm×75 mm is fixed to the specimen table. The specimen table can be tilted through 30°, in such a way that, during tilting, a medium requiring testing comes into contact with a force sensor. The force determined in mN via the sensor represents a value that can be compared with flexural stiffness.

B) Dart-Drop Test

The dart drop test was carried out by a method based on falling-ball tests (for example DIN 52306, 52338) and stone-impact tests (cf. DIN 20567-3). In this test, an object accelerated under gravity falls onto a test substrate, and the resultant damage is evaluated.

The falling projectile was guided within a tube in order to obtain a precise impact area. The impactor moreover had a defined impact area and impact profile, thus making it possible to study the effect of point loads in comparison with area loads. The kinetic energy on impact was used as controllable variable of the projectile, and can be varied via mass and also via drop height. The energy can either be calculated from the drop height or else determined by way of the projectile's velocity at impact. The velocity was determined by using a light-beam system.

The impactor used was a stainless steel cylinder with a cut-out. The impact area of the impactor was 90 $mm^2$, calculated as difference between the area of the base circle of the cylinder and the area of the cut-out. The impactor weighed 400 g.

The variables measured as results were the extent of damage to the substrate and the extent of damage to the adhesive tape. The studies used the edge of a sheet of float glass of thickness 6 mm to which relevant edge-protection tapes had been applied. The extent of damage to edge-protection tape and glass was the measured variable studied.

For evaluation of each test, a value was selected from four distinguishable classifications between which clear differences existed.

These were:

Classification 1: no damage or only minimal deformation of the protective tape;
Classification 2: distinct damage to the edge-protection tape, tape penetrated by impact;
Classification 3: clearly visible penetration of the tape, but no damage to the glass surface;
Classification 4: damage to the float glass.

Evaluation was achieved by awarding points for the individual criteria. The first step here was to evaluate the occurrence of damage in classification 4 on a yes/no system. If damage in classification 4 had occurred, zero points were awarded in each of the columns "glass breakage" and "damage".

If no damage in classification 4 had occurred, 5 baseline points were then awarded for the "glass breakage" criterion, and were doubled or trebled as appropriate to reflect the drop height of the impactor (1 m, 1.5 m and 2 m). If, therefore, no damage in classification 4 was discernible at a drop height of 2 m, 15 points were awarded for "glass breakage". The extent of damage to the adhesive tape was also evaluated by using further points. Here, damage in classification 1 was evaluated at 5 points, damage in classification 2 at 3 points and damage in classification 3 at 1 point, in each case under the criterion "extent of damage".

Finally, points were also awarded for what is known as "edge lift", i.e. if the adhesive tape remained in the position surrounding the edges after it had been adhesive-bonded around the edges of the float glass. If this was the case around the entire parameter, 10 points were awarded. If there was clear separation of the adhesive tape from the substrate by departing from the U-shaped position surrounding the edge because of lift of the "arms" of the U, zero points were awarded. Appropriate intermediate assessments were possible by award of 2, 4, 6 or 8 points (2 points for lift/separation which was severe, although not complete, 8 points for only slight separation).

The total number of points achieved was calculated. A large number of points corresponds to compliance with the usage criteria, while a relatively low number of points signifies defects. The maximum number of points achievable in accordance with the descriptions above was 30. Table 1 collates the results.

Hard and Soft Phases:
Hard phase H1: PET foil of thickness 12 μm
Hard phase H2: PET foil of thickness 75 μm
Hard phase H3: PE foil of thickness 135 μm
Hard phase H4: HDPE foil of thickness 35 μm
Hard phase H5: PU foil of thickness 300 μm
Soft phase S1: Foam of density 140 kg/m$^3$ made of PE-EVA blend (70% by weight of PE, 30% by weight of EVA), thickness 400 μm; provided with a resin-modified pressure-sensitive polyacrylate adhesive composition of thickness 50 μm respectively on the upper and lower side
Soft phase S2: Foam of density 140 kg/m$^3$ made of PE-EVA blend (70% by weight of PE, 30% by weight of EVA), thickness 800 μm; provided with a resin-modified pressure-sensitive polyacrylate adhesive composition of thickness 50 μm respectively on the upper and lower side
Soft phase S3: Self-adhesive polyacrylate foam of thickness 800 μm
Soft phase S4: Polyacrylate foam of thickness 1000 μm, provided with a resin-modified pressure-sensitive polyacrylate adhesive composition of thickness 50 μm respectively on the upper and lower side To the extent that the Comparative Examples used no (inventive) soft phase, the hard phases were adhesive-bonded on the substrate by using a resin-modified pressure-sensitive polyacrylate adhesive composition of thickness 50 μm.

TABLE 1

| | | | Dart-drop test results | | | |
|---|---|---|---|---|---|---|
| No. | Hard phase | Soft phase | Drop height | Glass breakage | Extent of damage | Edge life | Σ |
| According to the invention | | | | | | | |
| 1 | H1 | S2 | 2 m | 15 | 1 | 10 | 26 |
| 2 | H1 | S4 | 2 m | 15 | 1 | 8 | 24 |
| 3 | H2 | S3 | 2 m | 15 | 3 | 8 | 26 |
| 4 | H2 | S4 | 2 m | 15 | 3 | 10 | 28 |
| 5 | H3 | S1 | 2 m | 15 | 1 | 10 | 26 |
| 6 | H3 | S2 | 2 m | 15 | 1 | 10 | 26 |
| 7 | H3 | S3 | 2 m | 15 | 1 | 8 | 24 |
| 8 | H4 | S3 | 2 m | 15 | 1 | 8 | 24 |
| 9 | H4 | S2 | 2 m | 15 | 1 | 10 | 26 |
| Comparison | | | | | | | |
| 10 | H5 | none | 2 m | 0 | 0 | 10 | 10 |
| 11 | H2 | none | 2 m | 0 | 0 | 8 | 8 |
| 12 | H4 | none | 2 m | 0 | 0 | 10 | 10 |
| 13 | none | S2 | 2 m | 0 | 0 | 10 | 10 |

The invention claimed is:

1. Adhesive tape for the protection of glass edges, comprising, in sequence directed towards the substrate to be covered,
    a hard phase which is a backing layer, and
    a soft phase having a polymer basis selected from polyolefins and polyacrylates, and mixtures thereof, said soft phase comprising a polymer foam,
    where the thickness of the hard phase is ≤150 μm, the thickness of the soft phase is ≥200 μm and the ratio of the thickness of the soft phase to the thickness of the hard phase is ≥4,
    wherein the soft phase comprises a first pressure-sensitive adhesive layer arranged above the polymer foam and a second pressure-sensitive adhesive layer arranged below the polymer foam.

2. The adhesive tape according to claim 1, wherein the hard phase comprises a polymer selected from the group consisting of polyvinyl chlorides, polyethylene terephthalates, polyurethanes, polyolefins, polybutylene terephthalates, polycarbonates, polymethyl methacrylates, polyvinyl butyrals, ionomers and mixtures of two or more thereof.

3. The adhesive tape according to claim 2 wherein polymer basis of the hard phase is one selected from the group consisting of polyvinyl chlorides, polyethylene terephthalates, polyurethanes, polyolefins and mixtures thereof.

4. The adhesive tape according to claim 1 wherein the thickness of the soft phase is up to 1800 μm.

5. The adhesive tape according to claim 1 wherein the flexural stiffness of the hard phase is at most 10 mN/mm.

6. A solar module comprising an adhesive tape according to claim 5, wherein the adhesive is bonded around at least one portion of the edges of the solar module.

7. The adhesive tape according to claim 1 wherein the thickness of the soft phase is 300-1500 μm.

8. The adhesive tape according to claim 1, wherein the polymer foam has a polymer basis selected from one or more polyolefins, and the pressure-sensitive adhesive layers has a polymer basis selected from one or more polyacrylates.

9. The adhesive tape according to claim 1, wherein the polymer foam has a pressure-sensitive adhesion property, and a polymer basis composed of one or more polyacrylates.

* * * * *